(12) United States Patent
Butler et al.

(10) Patent No.: US 6,495,994 B1
(45) Date of Patent: Dec. 17, 2002

(54) REGULATOR CIRCUIT FOR INDEPENDENT ADJUSTMENT OF PUMPS IN MULTIPLE MODES OF OPERATION

(75) Inventors: Hal Butler, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/938,615

(22) Filed: Aug. 27, 2001

(51) Int. Cl.$^7$ .................................................. G05F 1/40
(52) U.S. Cl. ...................................................... 323/273
(58) Field of Search ................................ 323/268, 270, 323/273, 274, 282, 284; 363/59, 60; 327/535, 536, 537, 538, 543; 365/226, 227

(56) References Cited

U.S. PATENT DOCUMENTS

| | | | |
|---|---|---|---|
| 5,553,295 A | * | 9/1996 | Pantelakis et al. .......... 395/750 |
| 5,563,499 A | | 10/1996 | Pinney |
| 5,698,972 A | | 12/1997 | Keeth |
| 5,721,506 A | | 2/1998 | Imam et al. |
| 5,726,944 A | | 3/1998 | Pelley, III et al. |
| 5,831,419 A | * | 11/1998 | Casper ........................ 323/274 |
| 5,955,914 A | | 9/1999 | Su et al. |
| 6,111,394 A | | 8/2000 | Casper |

* cited by examiner

*Primary Examiner*—Matthew Nguyen
(74) *Attorney, Agent, or Firm*—Dickstein Shapiro Morin & Oshinsky

(57) ABSTRACT

A regulator circuit with at least two independently selectable and adjustable adjustment circuits. Each adjustment circuit may be connected across a standard voltage divider circuit used to create a reference voltage for operating a voltage pump. Between each adjustment circuit and the voltage divider circuit is an associated connection circuit that is controlled by an associated control signal. When activated by its respective control signal, the connection circuit connects its associated adjustment circuit to the voltage divider circuit so that the reference voltage is generated by the voltage divider as adjusted by the connected adjustment circuit. The amount of adjustment each adjustment circuit can introduce is independently selectable, the regulator circuit can adjust the operation of the pump for different modes of operation and can compensate for process variations without the need to re-design, re-mask or re-fabricate the circuitry.

35 Claims, 4 Drawing Sheets

REGULATOR CIRCUIT FOR INDEPENDENT ADJUSTMENT OF PUMPS IN MULTIPLE MODES OF OPERATION

FIELD OF THE INVENTION

The present invention relates generally to memory devices and, more particularly, to a voltage regulator circuit for the independent adjustment of pumps in multiple modes of operation of the memory device.

BACKGROUND OF THE INVENTION

A semiconductor device may be designed for any of a wide variety of applications. Typically, the device includes logic circuitry to receive, manipulate or store input data. The circuitry subsequently generates the same or modified data at an output terminal of the device. Depending on the type of semiconductor device or the circuit in which it is used, the device typically includes circuits which provide internal power signals that are regulated to be substantially independent of fluctuations in the externally generated power input signal(s).

An example of a data storage or memory device having such internal power signal circuits is the DRAM (dynamic random access memory). Conventionally, the DRAM receives an external power signal (Vccx) having a voltage intended to remain constant, for example, at 4.5 volts measured relative to ground. Internal to the DRAM, the power regulation circuit maintains an internal operating voltage signal (Vcc) at a designated level, for example, 2.5 volts. Ideally, Vcc linearly tracks Vccx from zero volts to the internal operating voltage level, at which point Vcc remains constant as Vccx continues to increase in voltage to the designated Vccx level.

DRAMs also typically include a regulated constant pumped supply voltage (Vccp) which is greater than Vcc, for example, four volts. Conventionally, the pumped voltage drives the word lines of a DRAM. The DRAM has memory arrays consisting of a number of intersecting row and column lines of individual transistors or memory cells. The pumped voltage needs to be greater than Vcc to ensure that memory access operations, such as a memory cell reads or writes, are performed both completely and quickly. Ideally, Vccp does not fluctuate. If Vccp is too high, damage to the memory cells may result. If it is too low, the memory chip may have poor data retention or may otherwise operate incorrectly.

The pump used to create the pumped voltage is typically referred to as a Vccp pump. In addition to the Vccp pump, a pump regulator is required and an oscillator may be used to ensure that the pumped voltage Vccp falls within the desired limits described above. The most common oscillator used in the Vccp pump is a standard CMOS (complementary metal oxide semiconductor) ring oscillator. A unique feature of the standard CMOS oscillator is its multi-frequency operation due to its multiplexed circuitry and various oscillator tap points. The oscillator is controlled by a control signal generated by the pump regulator. Whenever the pump regulator issues a pump enable control signal, the oscillator becomes functional and the pump becomes operative.

FIG. 1 illustrates a conventional pump regulator circuit 10. The regulator circuit 10 includes a step down resistance 12, a voltage divider circuit 20, voltage adjustment circuit 40 and a level detect circuit 14. The step down resistance 12 is connected to the pumped voltage Vccp, which is input from a Vccp pump (not shown). The step down resistance 12 is illustrated as a resistor, but it should be appreciated that the resistance 12 could consist of multiple resistors, transistors, diodes, any combinations of these elements or any other circuit element that would cause the pumped voltage Vccp to drop by a specified voltage amount.

The voltage divider circuit 20 is connected between the step down resistance 12 and another voltage (illustrated as a ground potential). The illustrated voltage divider circuit 20 includes a plurality (e.g., five) of series connected n-channel MOSFET (metal oxide semiconductor field-effect transistor) transistors 22, 24, 26, 28, 30. Each transistor 22, 24, 26, 28, 30 has its gate connected to a voltage such as Vcc such that they are always in the active state. In addition, each transistor 22, 24, 26, 28, 30 is typically a long "L" device that causes a relatively small current draw when activated (i.e., it is well known in the art that the amount of current a MOSFET can carry is proportional to W/L, where W is the width of the transistor and L is its gate length). Thus, if there were no other elements in the circuit 10, the resistance 12 and the voltage divider circuit 20 would divide the pumped voltage Vccp in accordance with their resistances and cause a predetermined reference voltage Vref to appear at node A. It should be noted that the voltage divider circuit 20 may comprise other elements besides the illustrated transistors 22, 24, 26, 28, 30 and it should be appreciated that the circuit 20 could consist of multiple resistors, transistors, diodes, any combinations of these elements or any other circuit element that would create resistance effecting the voltage in a desired manner.

The reference voltage Vref is input into the level detect circuit 14. The circuit 14 can be any conventional circuit and thus, the internal circuitry of the level detect circuit 14 is not shown for convenience purposes. As is known in the art, in operation the typical level detect circuit 14 inputs the reference voltage Vref (sometimes referred to as a normalized voltage) and compares it to a threshold voltage, which when exceeded, provides a signal to turn off the pump. Similarly, if the reference voltage Vref is less than the threshold, the circuit 14 provides a signal that turns on the pump. This is typically done by feeding the reference voltage into a modified inverter stage having an adjustable trip point. The trip point is modified with feedback to provide hysteresis for the circuit 14. Subsequent inverter stages provide additional gain and boost the reference voltage signal to the full CMOS level necessary to enable or disable the oscillator. Minimum and maximum operating voltages for the Vccp pump are controlled by the first inverter stage trip point, hysteresis and diode connected transistors voltages.

The output of the level detect circuit 14 is a pump on/off signal. The pump on/off signal is used as a control signal for the oscillator (not shown) connected to the Vccp pump. Whenever the pump on/off signal is set to a value indicating that the Vccp pump should be enabled, the oscillator becomes functional and enables the pump.

There is a need for the regulator circuit 10 to operate based on different operating voltages (e.g., Vcc) and pumped voltages (e.g., Vccp). The different voltages may be required, for example, because a particular system has a manufacturing specification mandating specific operating and pumped voltages. Accordingly, the regulator circuit 10 typically includes the adjustment circuit 40 to adjust the voltage divider circuit 20 so that the proper pump on/off signal PUMP ON/OFF can be generated regardless of the Vcc and Vccp voltage levels.

The adjustment circuit 40 includes a plurality (e.g., five) of n-channel MOSFET transistors 42, 44, 46, 48, 50. Each transistor 42, 44, 46, 48, 50 has their source and drain terminal connected across the source and drain terminal of a respective voltage divider transistor 22, 24, 26, 28, 30. Unlike the gate terminals of the voltage divider transistor 22, 24, 26, 28, 30, the gate terminals of the adjustment transistors 42, 44, 46, 48, 50 do not have to be connected such that they are always in the active state. Instead, the gate of each adjustment transistor 42, 44, 46, 48, 50 can be connected such that the transistor 42, 44, 46, 48, 50 is active or inactive.

For example, in FIG. 1, the fourth and fifth adjustment transistors 48, 50 are connected to a voltage such as Vcc, which activates both transistors 48, 50. With both of these adjustment transistors 48, 50 in the active state, their corresponding voltage divider transistors 28, 30 are shunted. This, removes the resistances associated with the fourth and fifth voltage divider transistors 28, 30, which changes the voltage divider circuit 20 and alters the voltage level of the reference voltage Vref. Thus, the adjustment transistors 48, 50 act as switches that can switch in or out (i.e., do not shunt or shunt) the resistance associated with their corresponding voltage divider transistors 28, 30.

As noted above, the other adjustment transistors 42, 44, 46 do not have to connected such that they are always in the active state either. For example, the first three adjustment transistors 42, 44, 46 are connected to two signal lines OPT1, OPT2. The signal lines OPT1, OPT2 can be set by test keys, fuses or any other manner such that their respective adjustment transistors 42, 44, 46 are active or inactive. If any of these adjustment transistors 42, 44, 46 are set to the active state, then their corresponding divider transistor 22, 24, 26 will be shunted. Likewise, if any of the first three adjustment transistors 42, 44, 46 are set to the inactive state, then their corresponding divider transistor 22, 24, 26 will not be shunted. Thus, for the illustrated regulator circuit 10, depending on how the signal lines OPT1, OPT2 are set, the voltage divider circuit 20 may include none, all three or some of the first three divider transistors 22, 24, 26 (i.e., in FIG. 1 the fourth and fifth divider transistors 28, 30 have already been shunted and thus, only the first three divider transistors 22, 24, 26 can add resistance to the divider circuit 20).

Thus, depending upon the manufacturing specifications of the memory circuit utilizing the pumped voltage Vccp and the regulator circuit 10, the adjustment circuit 40 can be configured such that the voltage divider circuit 20 generates the proper reference voltage Vref Typically, the regulator circuit 10 controls the oscillator such that it is operated at a higher frequency when the DRAM is in a power-up operating mode than in nominal operation because this will assist the Vccp pump in initially charging DRAM components such as load capacitors. There is a third operating mode that often requires the regulator circuit 10 to operate the oscillator/pump in a different manner. This third mode known as the burn-in mode, which is a test mode, often times requires a much different pumped voltage Vccp than the one used during nominal operation. To compensate for this, the regulator circuit 10 often contains a burn-in transistor 60. The burn-in transistor 60 has its source and drain connected across the source and drain of one of the voltage divider transistors 26. The gate of the burn-in transistor 60 is connected to a burn-in signal line BURNIN. When the memory circuit utilizing the regulator circuit 10 undergoes a burn-in test, the burn-in signal line BURNIN is activated, which activates the burn-in transistor 60. Once activated, the burn-in transistor 60 shunts its corresponding voltage divider transistor 26, which alters the voltage divider circuit 20 and the reference voltage Vref.

As can be seen from FIG. 1, the prior art regulator circuit 10 can only shunt one divider transistor 26 during burn-in mode. If a vastly different pumped voltage Vccp is required for the burn-in test, then the voltage divider and adjustment circuits 20, 40 would require some modifications. This solution is unacceptable because this changes the design of the circuit 10 for nominal operation, which has been designed, tested and qualified as meeting nominal operating mode specifications. Once the design is changed, the part would have to be re-tested and re-qualified for all modes of operation. Moreover, the only way to change the design of the circuitry 10 would be to re-mask and re-fabricate it. This would be rather costly with respect to time and money.

Accordingly, there is a desire and need for a regulator circuit that can adjust the operation of the Vccp pump for different independent modes of operation (e.g., nominal and burn-in modes) that would not require re-designing, re-masking or the re-fabrication of its circuitry.

Furthermore, manufacturing process variations may render the capability of the burin-in transistor 60, adjustment circuit 40 and voltage divider circuit 20 ineffective for their intended purposes, which could adversely impact the pumped voltage Vccp. Process variations could render one lot of memory circuits different from another lot of memory circuits even though they utilize the same mask, design, etc. This could lead to unexpected variations of the pumped voltage Vccp. As noted earlier, if Vccp is too high, damage to the memory cells, and higher current may result, if it is too low, the memory chip may have poor data retention or may otherwise operate incorrectly.

Accordingly, there is a desire and need for a regulator circuit that can adjust the operation of the Vccp pump for different modes of operation that can compensate for process variations.

SUMMARY OF THE INVENTION

The present invention provides a regulator circuit that can adjust the operation of a voltage pump for different independent modes of operation without re-designing, re-masking or re-fabricating its circuitry.

The present invention also provides a regulator circuit that can adjust the operation of the voltage pump for different modes of operation that can compensate for process variations.

The above and other features and advantages are achieved by providing a regulator circuit with at least two independently selectable and adjustable adjustment circuits. Each adjustment circuit is adapted to be connected across a standard voltage divider circuit used to create a reference voltage for operating a voltage pump. Between each adjustment circuit and the voltage divider circuit is an associated connection circuit. Each connection circuit is controlled by an associated control signal. When activated by its respective control signal, the connection circuit connects its associated adjustment circuit to the voltage divider circuit so that the reference voltage is generated by the voltage divider circuit as adjusted by the connected adjustment circuit. Since the amount of adjustment each adjustment circuit can introduce is also independently selectable, the regulator circuit can adjust the operation of the voltage pump for different modes of operation that can compensate for process variations without the need to re-design, re-mask or re-fabricate the circuitry.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Figure 2:
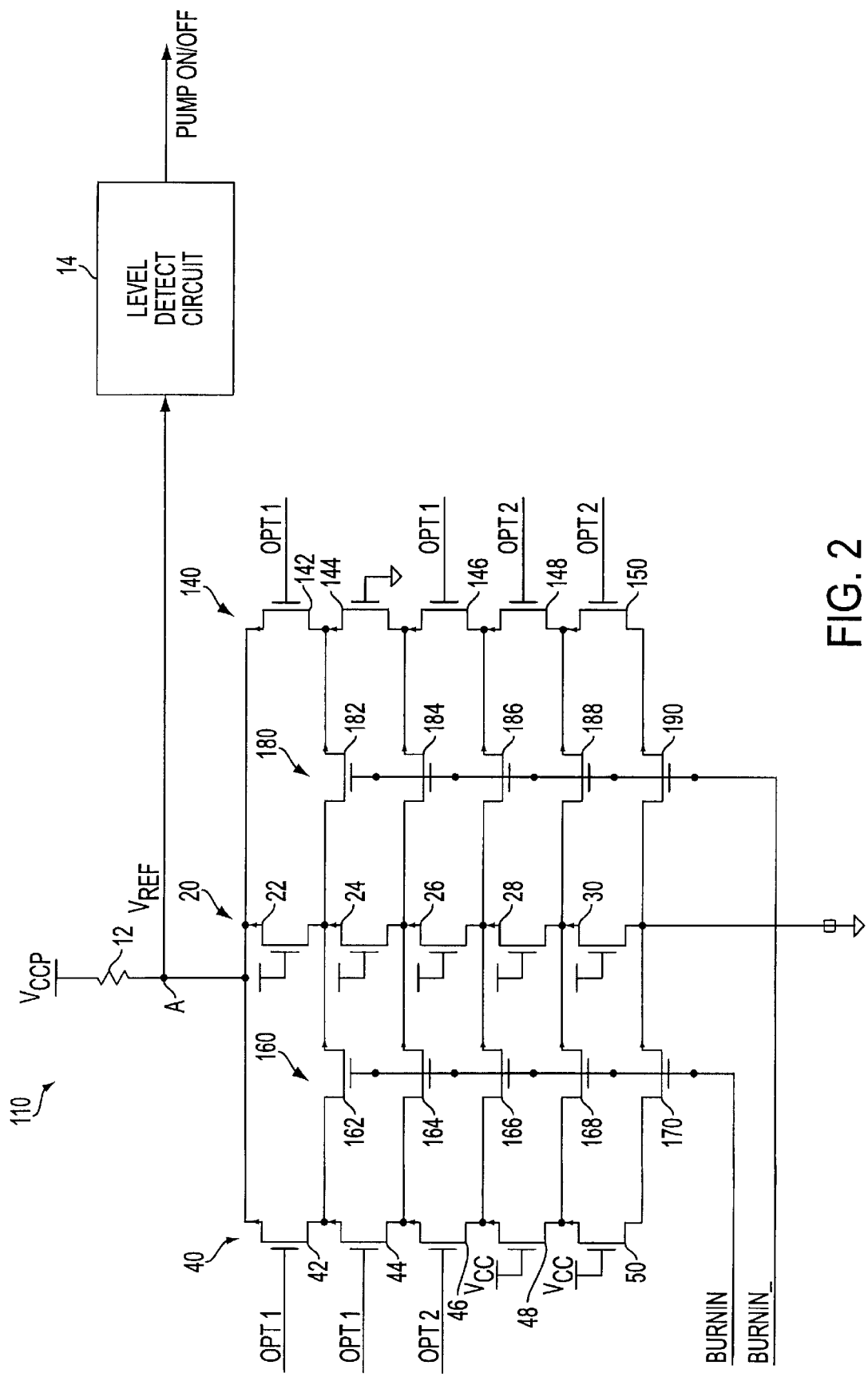
FIG. 2 illustrates a pump regulator constructed in accordance with an exemplary embodiment of the invention.

FIG. 2 illustrates a pump regulator circuit 110 constructed in accordance with an exemplary embodiment of the invention. The regulator circuit 110 includes a step down resistance 12, voltage divider circuit 20, first voltage adjustment circuit 40, second voltage adjustment circuit 140, first connection circuit 160, second connection circuit 180, and a level detect circuit 14. The step down resistance 12 is connected to the pumped voltage Vccp, which is input from a Vccp pump (not shown). The step down resistance 12 is illustrated as a resistor, but it should be appreciated that the resistance 12 could consist of multiple resistors, transistors, diodes, any combinations of these elements or any other circuit element that would cause the pumped voltage Vccp to drop by a specified voltage amount.

The voltage divider circuit 20 is connected between the step down resistance 12 and another voltage (illustrated as a ground potential). The illustrated voltage divider circuit 20 includes five series connected n-channel MOSFET transistors 22, 24, 26, 28, 30. Each transistor 22, 24, 26, 28, 30 has its gate connected to a voltage such as Vcc such that they are always in the active state. In addition, each transistor 22, 24, 26, 28, 30 is typically a long "L" device that causes a relatively small current draw when activated (i.e., it is well known in the art that the amount of current a MOSFET can carry is proportional to W/L, where W is the width of the transistor and L is its gate length). Thus, if there were no other elements in the circuit 110, the resistance 12 and the voltage divider circuit 20 would divide the pumped voltage Vccp in accordance with their resistances and cause a predetermined reference voltage Vref to appear at node A. It should be noted that the voltage divider circuit 20 may comprise other elements besides the illustrated transistors 22, 24, 26, 28, 30 and it should be appreciated that the circuit 20 could consist of multiple resistors, transistors, diodes, any combinations of these elements or any other circuit element that would create resistance effecting the voltage in a desired manner.

The reference voltage Vref is input into the level detect circuit 14. The circuit 14 can be any conventional circuit and thus, the internal circuitry of the circuit 14 is not shown for convenience purposes. As is known in the art, in operation the typical level detect circuit 14 inputs the reference voltage Vref and compares it to a threshold voltage, which when exceeded, provides a signal to turn on the pump. Similarly, if the reference voltage Vref is less than the threshold, the circuit 14 provides a signal that turns off the pump. This is typically done by feeding the reference voltage into a modified inverter stage having an adjustable trip point. The trip point is modified with feedback to provide hysteresis for the circuit 14. Subsequent inverter stages provide additional gain and boost the reference voltage signal to the full CMOS level necessary to drive the oscillator. Minimum and maximum operating voltages for the Vccp pump are controlled by the first inverter stage trip point, hysteresis and diode connected transistors voltages.

The output of the level detect circuit 14 is a pump on/off signal. The pump on/off signal is used as a control signal for an oscillator 223 (FIG. 3) connected to the Vccp pump 224. Whenever the pump on/off signal is set to a value indicating that the Vccp pump should be enabled, the oscillator becomes functional and enables the pump.

Figure 1:
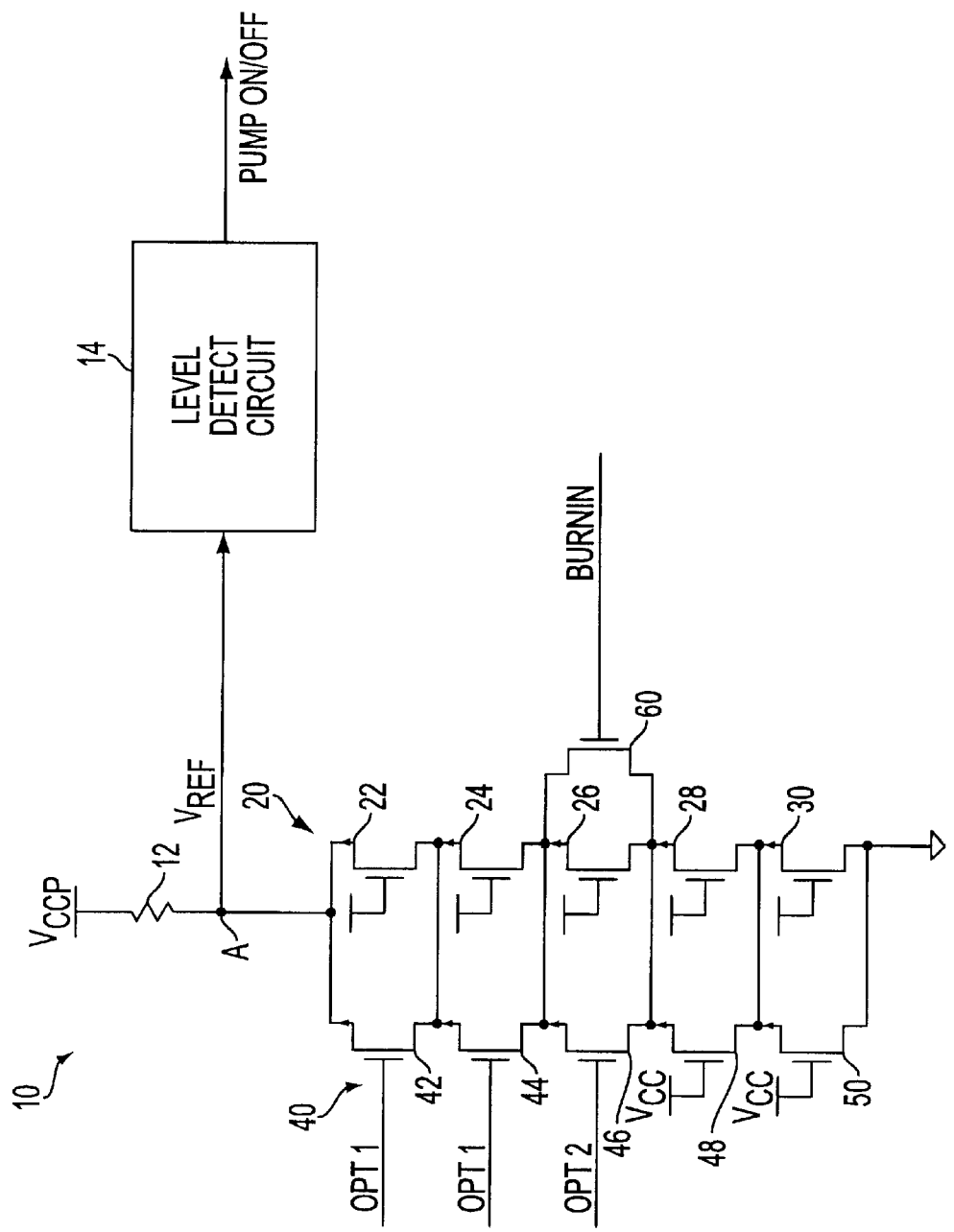
FIG. 1 illustrates a conventional pump regulator circuit.

Unlike the prior art regulator circuit 10 (FIG. 1), the regulator circuit 110 of the illustrated embodiment includes two adjustment circuits 40, 140 to adjust the voltage divider circuit 20 so that the proper pump on/off signal can be generated regardless of the Vcc and Vccp voltage levels and, most importantly, regardless of process variations and the variations resulting from age of the circuit 110—something the prior art could not due without re-designing, re-masking and re-fabricating the circuit 110 (which also leads to re-qualifying the final product due to the new design).

The first adjustment circuit 40 includes five n-channel MOSFET transistors 42, 44, 46, 48, 50. Each transistor 42, 44, 46, 48, 50 is connected across a respective voltage divider transistor 22, 24, 26, 28, 30 through connection transistors 162, 164, 166, 168, 170 of the first connection circuit 160. The connection transistors 162, 164, 166, 168, 170 are connected to a first control signal BURNIN.

If during operation, the first control signal BURNIN has a value that activates the connection transistors 162, 164, 166, 168, 170, the connection transistors 162, 164, 166, 168, 170 connect the adjustment transistors 42, 44, 46, 48, 50 to the voltage divider transistors 22, 24, 26, 28 and 30. That is, the first connection circuit 160 connects the first adjustment circuit 40 to the voltage divider circuit 20. If during operation, the first control signal BURNIN has a value that does not activate the connection transistors 162, 164, 166, 168, 170, the connection transistors 162, 164, 166, 168, 170 disconnect the adjustment transistors 42, 44, 46, 48, 50 from the voltage divider transistors 22, 24, 26, 28 and 30. That is, the first connection circuit 160 disconnects the first adjustment circuit 40 from the voltage divider circuit 20. It should be noted that the first control signal BURNIN may be generated by a test key or any other device or in any manner known in the art and that the exact method of doing so is not relevant to practice the invention.

Unlike the gate terminals of the voltage divider transistor 22, 24, 26, 28, 30, the gate terminals of the adjustment transistors 42, 44, 46, 48, 50 do not have to be connected such that they are always in the active state. Instead, the gate of each adjustment transistor 42, 44, 46, 48, 50 can be connected such that the transistor 42, 44, 46, 48, 50 is active or inactive. For the following example, it is presumed that the first control signal BURNIN is in the state that activates the connection transistors 162, 164, 166, 168, 170, and thus, connects the adjustment transistors 42, 44, 46, 48, 50 to the voltage divider transistors 22, 24, 26, 28, 30. For example, in FIG. 2, the fourth and fifth adjustment transistors 48, 50 are connected to a voltage such as Vcc, which activates both transistors 48, 50. With both of these adjustment transistors 48, 50 in the active state, their corresponding voltage divider transistors 28, 30 are shunted. This, removes the resistances associated with the fourth and fifth voltage divider transistors 28, 30, which changes the voltage divider circuit 20 and alters the voltage level of the reference voltage Vref. Thus, the adjustment transistors 48, 50 act as switches that can switch in or out (i.e., do not shunt or shunt) the resistance associated with their corresponding voltage divider transistors 28, 30.

As noted above, the other adjustment transistors 42, 44, 46 do not have to connected such that they are always in the active state. For example, the first three adjustment transistors 42, 44, 46 are connected to two signal lines OPT1, OPT2. The signal lines OPT1, OPT2 can be set by test keys or fuses such that their respective adjustment transistors 42, 44, 46 are active or inactive. If any of these adjustment transistors 42, 44, 46 are set to the active state, then their corresponding divider transistor 22, 24, 26 will be shunted. Likewise, if any of the first three adjustment transistors 42, 44, 46 are set to the inactive state, then their corresponding divider transistor 22, 24, 26 will not be shunted. Thus, for the illustrated regulator circuit 110, depending on how the signal lines OPT1, OPT2 are set, the voltage divider circuit 20 may include none, all three or some of the first three divider transistors 22, 24, 26 (i.e., in FIG. 1 the fourth and fifth divider transistors 28, 30 have already been shunted and thus, only the first three divider transistors 22, 24, 26 can add resistance to the divider circuit 20) when the first control signal BURNIN is in a state that activates the connection transistors 162, 164, 166, 168, 170, causing adjustment transistors 42, 44, 46, 48, 50 to be connected to the voltage divider transistors 22, 24, 26, 28, 30.

Similarly, the second adjustment circuit 140 includes five n-channel MOSFET transistors 142, 144, 146, 148, 150. Each transistor 142, 144, 146, 148, 150 is connected across a respective voltage divider transistor 22, 24, 26, 28, 30 through connection transistors 182, 184, 186, 188, 190 of the second connection circuit 180. The connection transistors 182, 184, 186, 188, 190 are connected to a second control signal BURNIN_.

If during operation, the second control signal BURNIN_ has a value that activates the connection transistors 182, 184, 186, 188, 190, the connection transistors 182, 184, 186, 188, 190 connect the adjustment transistors 142, 144, 146, 148, 150 to the voltage divider transistors 22, 24, 26, 28 and 30. Thus, the second connection circuit 180 connects the second adjustment circuit 140 to the voltage divider circuit 20. If during operation, the second control signal BURNIN_has a value that does not activate the connection transistors 182, 184, 186, 188, 190, the connection transistors 182, 184, 186, 188, 190 disconnect the adjustment transistors 142, 144, 146, 148, 150 from the voltage divider transistors 22, 24, 26, 28, 30. Thus, the second connection circuit 180 disconnects the second adjustment circuit 140 from the voltage divider circuit 20. It should be noted that the second control signal BURNIN_may be generated by a test key or any other device or in any manner known in the art and that the exact method of doing so is not relevant to practice the invention.

Unlike the gate terminals of the voltage divider transistor 22, 24, 26, 28, 30, the gate terminals of the adjustment transistors 142, 144, 146, 148, 150 do not have to be connected such that they are always in the active state. Instead, the gate of each adjustment transistor 142, 144, 146, 148, 150 can be connected such that the transistor 142, 144, 146, 148, 150 is active or inactive. For the following example, it is presumed that the second control signal BURNIN_is in the state that activates the connection transistors 182, 184, 186, 188, 190, and thus, the connection transistors 182, 184, 186, 188, 190 connect the adjustment transistors 142, 144, 146, 148, 150 to the voltage divider transistors 22, 24, 26, 28, 30. For example, in FIG. 2, the second adjustment transistors 144 is connected to a ground potential, which permanently deactivates transistors 144. Thus, the associated voltage divider transistor 24 will not be shunted when the second adjustment circuit 140 is connected to the voltage divider circuit 20 by the second connection circuit 180. This, means that the resistance associated with the second voltage divider transistor 24 will remain in the voltage divider circuit 20.

In FIG. 2, the first and third adjustment transistors 142, 146 of the second adjustment circuit 140 are connected to the same signal line OPT1 while the fourth and fifth adjustment transistors 148, 150 of the second adjustment circuit 140 are connected to the a second signal line OPT2. The signal lines OPT1, OPT2 can be set by test keys or fuses such that their respective adjustment transistors 142, 146, 148, 150 are active or inactive. If any of these adjustment transistors 142, 146, 148, 150 are set to the active state, then their corresponding divider transistor 22, 26, 28, 30 will be shunted. Likewise, if any of these adjustment transistors 142, 146, 148, 150 are set to the inactive state, then their corresponding divider transistor 22, 26, 28, 30 will not be shunted. Thus, for the illustrated regulator circuit 110, depending on how the signal lines OPT1, OPT2 are set, the voltage divider circuit 20 will include the second voltage divider transistor 24 and may include none, all four or some of the first, third, fourth and fifth divider transistors 22, 26, 28, 30 when the second control signal BURNIN_ is in a state that activates the connection transistors 182, 184, 186, 188, 190, causing adjustment transistors 142, 144, 146, 148, 150 to be connected to the voltage divider transistors 22, 24, 26, 28, 30.

Typical operating modes for a system incorporating the regulator circuit 110 of the invention include power-up, nominal and burn-in modes. By connecting one of the adjustment circuits 40, 140 to the voltage divider 20 via the connection circuits 160, 180, or disconnecting both of the adjustment circuits 40, 140 from the voltage divider 20, the regulator circuit 110 can be independently adjusted for any of these modes. Moreover, each adjustment circuit 40, 140 can be adjusted such that they switch in or out (i.e., do not shunt or shunt) specific resistances from the voltage divider circuit 10. This way, variations due to process variations can be compensated for without the need to re-design, re-mask, re-fabricate and re-quality the circuitry.

To be consistent with the prior art regulator circuit 10 (FIG. 1) the first control signal illustrated in FIG. 2 is labeled BURNIN while the second control signal is labeled BURNIN_to represent burn-in and non-burn-in modes, respectively. It should be appreciated, however, that these signals can represent any desired mode of operation, e.g., power-up, and do not have to be tied to the burn-in mode of operation. Furthermore, it should be appreciated that the voltage divider 20 could contain more or less voltage divider transistors 22, 24, 26, 28, 30, which could alter the number of transistors used in the adjustment circuits 40, 140 and the connection circuit 160, 180, if so desired. Thus, the invention is not to be limited to the number of transistors used in any of these circuits 20, 40, 140, 160, 180.

Figure 3:
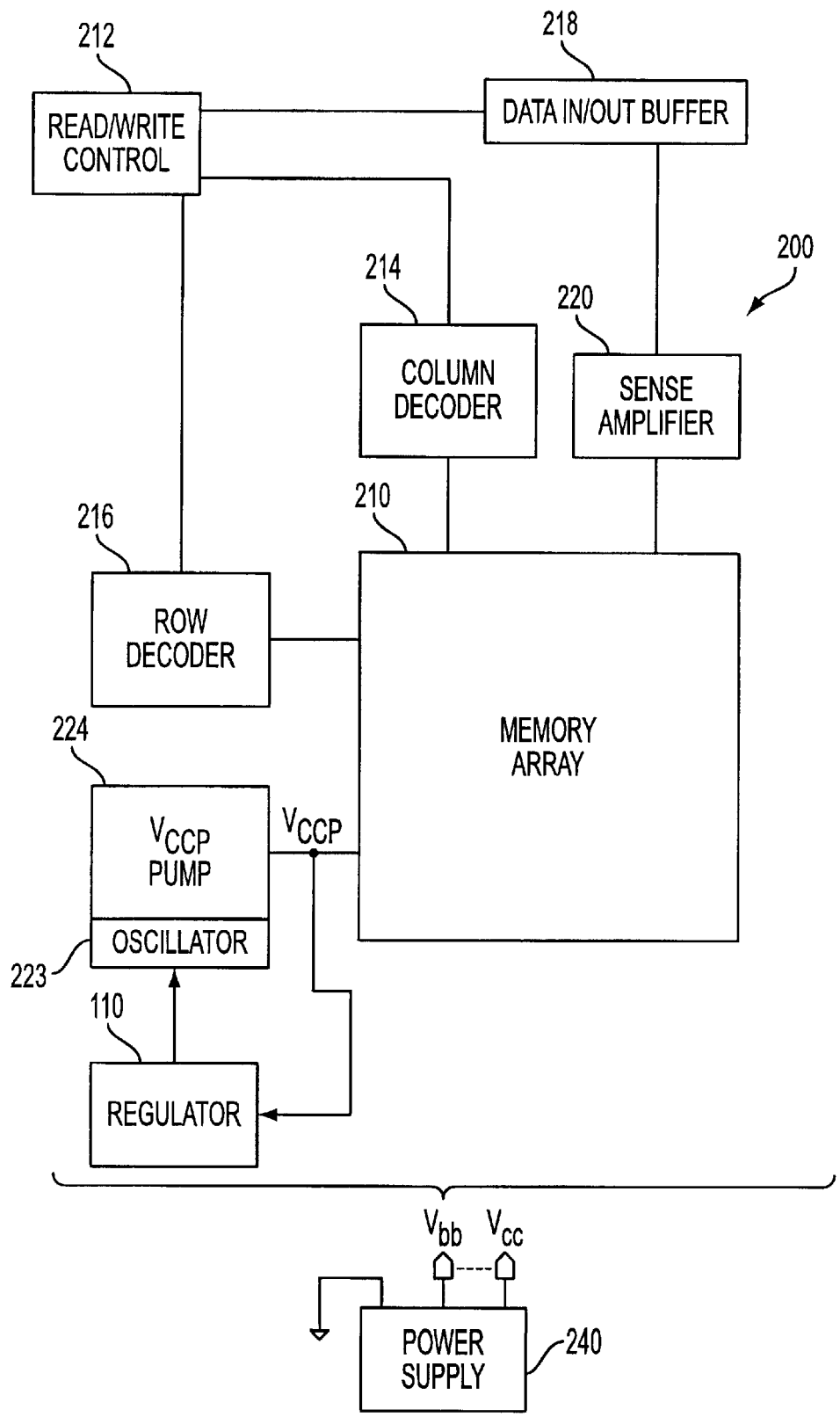
FIG. 3 illustrates a memory circuit incorporating a pump regulator constructed in accordance with an exemplary embodiment of the invention.

FIG. 3 illustrates a memory circuit 200 incorporating a regulator circuit 110 constructed in accordance with an embodiment of the invention. Thus, the memory circuit 200 will be capable of adjusting the pumped voltage Vccp for multiple modes of operation (e.g., nominal and burn-in modes) in accordance with the present invention. A conventional power supply 240 provides regulated power signals to a memory array 210 and its related memory access circuits. These power signals may include Vcc (i.e., the primary operating voltage for the circuit 200) and Vbb (i.e., the voltage level to which the substrate voltage is regulated).

The memory array 210 consists of a number of individual memory cells or transistors organized in rows and columns.

As known in the art, each memory cell can hold one of two states, corresponding to binary zero and binary one. For a data access (read or write) operation to be performed upon a particular memory cell within the array 210, a read/write control circuit 212 provides the row address of the cell to a row decoder 216 and the column address of the cell to a column decoder 214. Data in/out buffers 218 are used provide an interface for the data between the selected memory cell and external data (input/output) ports (not shown), which are coupled to the buffers 218.

A sense amplifier circuit 220, which is also controlled in part by the read/write control circuit 212, is used to convert the information provided by the selected memory cell to the appropriate voltage level for the data in/out buffer 218. Control over the timing and direction of data flow is provided by the read/write control circuit 212. Each of the above circuits is well known in the art and do not require further discussion.

To ensure accurate and fast access to the selected memory cells, a stable high-level pumped voltage Vccp is provided to the memory array 210 at a voltage level which is greater than Vcc. In a typical DRAM application, the voltage for Vcc may be set to about 2.5 volts, thereby requiring the pumped voltage Vccp to be set so as to safely operate more than one diode drop higher than Vcc. For example, if Vcc is set at 2.5 volts, setting Vccp to approximately 4.0 volts would be an acceptable design criteria. As noted above, the purpose of the regulator 110 and the Vccp pump circuit 224 (including oscillator 223) is to provide the pumped voltage Vccp at such a regulated level. In addition, the regulator 110 of the invention can adjust the pumped voltage Vccp for other operating modes (e.g., burn-in) in a manner that can compensate for process variations, etc. and which does not require mask changes or re-qualification of the completed memory circuit 200. It should be noted that the Vccp pump circuit 224 is conventional and may be implemented using any of a number of circuits.

Figure 4:
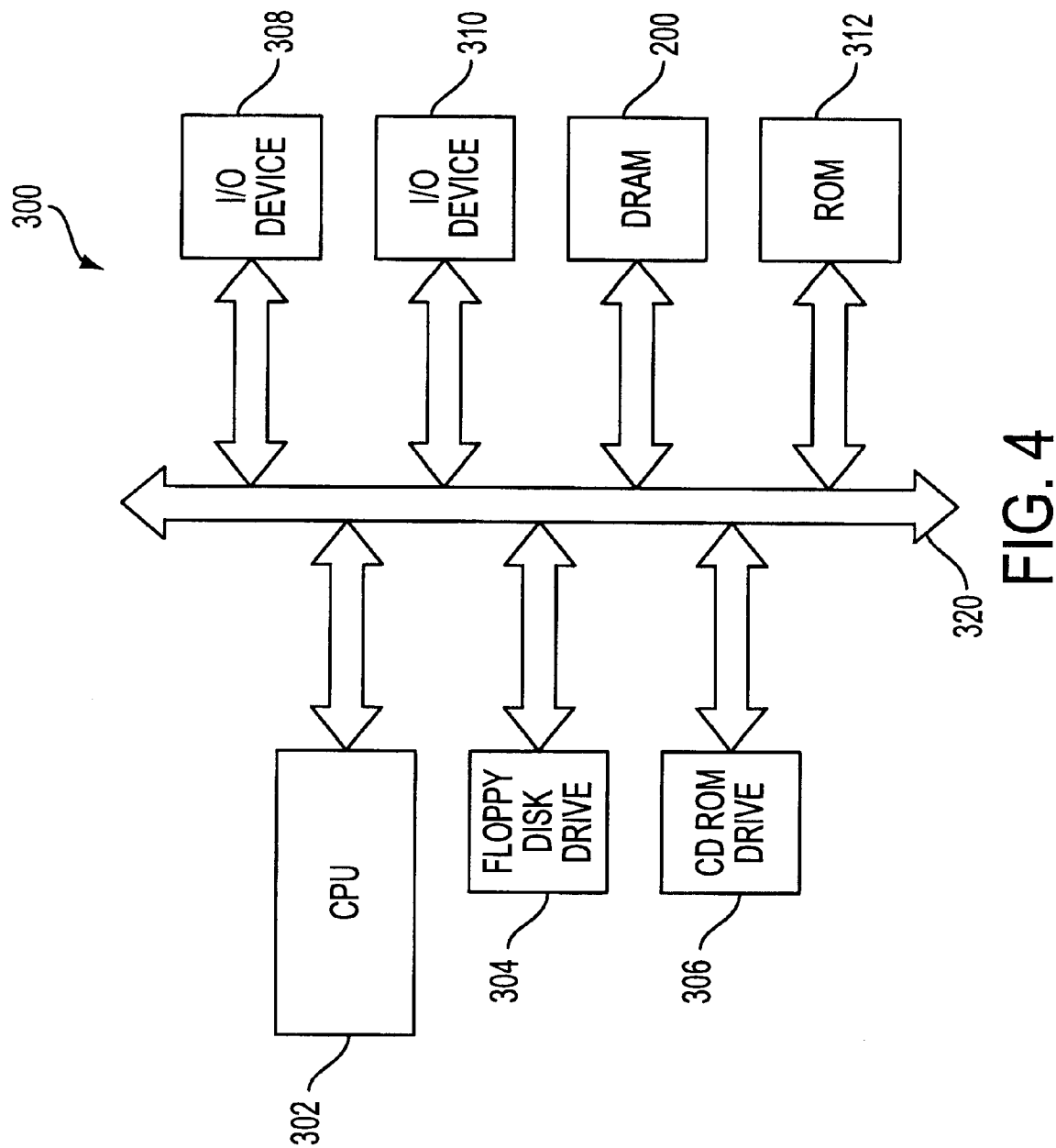
FIG. 4 illustrates a processor system incorporating a memory circuit constructed in accordance with an exemplary embodiment of the invention.

FIG. 4 illustrates a processor system 300 incorporating a memory circuit 200 constructed in accordance with an embodiment of the invention. That is, the memory circuit 200 may be configured as shown in FIG. 3 and may utilize the regulator circuit 110 illustrated in FIG. 2. The system 300 may be a computer system, a process control system or any other system employing a processor and associated memory.

The system 300 includes a central processing unit (CPU) 302, e.g., a microprocessor, that communicates with the memory circuit 200 and an I/O device 308 over a bus 320. It must be noted that the bus 320 may be a series of buses and bridges commonly used in a processor system, but for convenience purposes only, the bus 320 has been illustrated as a single bus. A second I/O device 310 is illustrated, but is not necessary to practice the invention. The system 300 may also include additional memory devices such as a read-only memory (ROM) device 312, and peripheral devices such as a floppy disk drive 304 and a compact disk (CD) ROM drive 306 that also communicates with the CPU 302 over the bus 320 as is well known in the art. It should be noted that the memory 200 may be embedded on the same chip as the CPU 302 if so desired.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A regulator circuit for a voltage pump, said regulator circuit comprising:

voltage divider means connected between a first and second voltage, said voltage divider means generating a reference voltage;

first adjustment means for adjusting a resistance of said voltage divider means to modify a voltage level of the reference voltage;

second adjustment means for adjusting the resistance of said voltage divider means to modify the voltage level of the reference voltage;

first connection means for connecting said first adjustment means to said voltage divider means in response to a first control signal, said first connection means disconnecting said first adjustment means from said voltage divider means when the first control signal is not received; and second connection means for connecting said second adjustment means to said voltage divider means in response to a second control signal, said second connection means disconnecting said second adjustment means from said voltage divider means when the second control signal is not received, wherein said first and second control signals independently control said first and second connection means.

2. The circuit of claim 1, wherein the first control signal is generated based on an operating mode of the circuit.

3. The circuit of claim 2, wherein the first control signal is generated when the operating mode is a nominal operating mode.

4. The circuit of claim 2, wherein the first control signal is generated when the operating mode is a burn-in operating mode.

5. The circuit of claim 2, wherein the first control signal is generated when the operating mode is a power-up operating mode.

6. The circuit of claim 1, wherein the second control signal is generated based on an operating mode of the circuit.

7. The circuit of claim 6, wherein the second control signal is generated when the operating mode is a nominal operating mode.

8. The circuit of claim 6, wherein the second control signal is generated when the operating mode is a burn-in operating mode.

9. The circuit of claim 6, wherein the second control signal is generated when the operating mode is a power-up operating mode.

10. The circuit of claim 1, wherein said voltage divider means comprises a series of resistance elements and said first adjustment means comprises a series of switching elements that are connected across respective resistance elements in response to the first control signal.

11. The circuit of claim 10, wherein each switching element can be independently placed into an active state, which switches out its respective resistance element.

12. The circuit of claim 10, wherein each switching element can be independently placed into an inactive state, which switched in its respective resistance element.

13. The circuit of claim 1, wherein said voltage divider circuit comprises a series of resistance elements and said second adjustment means comprises a series of switching elements that are connected across respective resistance elements in response to the second control signal.

14. The circuit of claim 13, wherein each switching element can be independently placed into an active state, which switches out its respective resistance element.

15. The circuit of claim 13, wherein each switching element can be independently placed into an inactive state, which switches in its respective resistance element.

16. The circuit of claim 1 further comprising level detecting means, said level detecting means receiving the reference voltage and generating a signal to operate the voltage pump.

17. A regulator circuit for a voltage pump, said regulator circuit comprising:
a voltage divider circuit connected between a first and second voltage, said voltage divider circuit having a resistance and outputting a reference voltage;
a first adjustment circuit;
a first connection circuit, said first connection circuit connecting said first adjustment circuit to said voltage divider circuit in response to a first control signal and disconnecting said first adjustment circuit from said voltage divider circuit when the first control signal is not received, said first adjustment circuit when connected to said voltage divider circuit adjusting the resistance of said voltage divider circuit to modify a voltage level of the reference voltage;
a second adjustment circuit; and
a said connection circuit, said second connection circuit connecting said second adjustment circuit to said voltage divider circuit in response to a second control signal and disconnecting said second adjustment circuit from said voltage divider circuit when the second control signal is not received, said second adjustment circuit when connected to said voltage divider circuit adjusting the resistance of said voltage divider circuit to modify a voltage level of the reference voltage, wherein said first and second control signals independently control said first and second connection circuit based upon an operating mode of said regulator circuit.

18. A regulator circuit for a voltage pump comprising:
a voltage divider having a resistance, said voltage divider generating a reference voltage based on the resistance; and
at least two adjustment circuits, each adjustment circuit is capable of being connected to said voltage divider in response to a respective control signal indicative of a respective operating mode of said regulator circuit and being adjustable to adjust the resistance of said voltage divider such that the reference voltage is generated at a respective predetermined level for the operating mode.

19. A memory circuit comprising:
a memory array;
a voltage pump for supplying pump voltage to said memory array; and
a regulator circuit connected to said voltage pump, said regulator circuit comprising:
a voltage divider circuit connected between a first and second voltage, said voltage divider circuit having a resistance and outputting a reference voltage used to operate said pump;
a first adjustment circuit;
a first connection circuit, said first connection circuit connecting said first adjustment circuit to said voltage divider circuit in response to a first control signal and disconnecting said first adjustment circuit from said voltage divider circuit when the first control signal is not received, said first adjustment circuit when connected to said voltage divider circuit adjusting the resistance of said voltage divider circuit to modify a voltage level of the reference voltage;
a second adjustment circuit; and
a said connection circuit, said second connection circuit connecting said second adjustment circuit to said voltage divider circuit in response to a second control signal and disconnecting said second adjustment circuit from said voltage divider circuit when the second control signal is not received, said second adjustment circuit when connected to said voltage divider circuit adjusting the resistance of said voltage divider circuit to modify a voltage level of the reference voltage, wherein said first and second control signals independently control said first and second connection circuit based upon an operating mode of said regulator circuit.

20. The circuit of claim 19, wherein the first control signal is generated when the operating mode is a nominal operating mode.

21. The circuit of claim 19, wherein the first control signal is generated when the operating mode is a burn-in operating mode.

22. The circuit of claim 19, wherein the first control signal is generated when the operating mode is a power-up operating mode.

23. The circuit of claim 19, wherein the second control signal is generated when the operating mode is a nominal operating mode.

24. The circuit of claim 19, wherein the second control signal is generated when the operating mode is a burn-in operating mode.

25. The circuit of claim 19, wherein the second control signal is generated when the operating mode is a power-up operating mode.

26. The circuit of claim 19, wherein the voltage divider circuit comprises a series of resistance elements and said first adjustment circuit comprises a series of shunting elements that are connected across respective resistance elements in response to the first control signal.

27. The circuit of claim 26, wherein each shunting element can be independently placed into an active state, which shunts its respective resistance element.

28. The circuit of claim 27, wherein each shunting element can be independently placed into an inactive state, which does not shunt its respective resistance element.

29. The circuit of claim 19, wherein said voltage divider circuit comprises a series of resistance elements and said second adjustment circuit comprises a series of shunting devices that are connected across respective resistance elements in response to the second control signal.

30. The circuit of claim 29, wherein each shunting device can be independently placed into an active state, which shunts its respective resistance element.

31. The circuit of claim 30, wherein each shunting device can be independently placed into an inactive state, which does not shunt in its respective resistance element.

32. The circuit of claim 19 further comprising a level detect circuit that receives the reference voltage and generates a signal to operate said voltage pump.

33. A memory circuit comprising:
a memory array;
a voltage pump for supplying a pump voltage to said memory array; and
a regulator circuit connected to said voltage pump, said regulator circuit comprising:

a voltage divider having a resistance, said voltage divider generating a reference voltage based on the resistance, said reference voltage being used to operate said pump; and at least two adjustment circuits, each adjustment circuit is capable of being connected to said voltage divider in response to a respective control signal indicative of a respective operating mode of said memory circuit and being adjustable to adjust the resistance of said voltage divider such that the reference voltage is generated at a respective predetermined level for the operating mode.

34. A processor system comprising:

a processor; and a memory circuit connected to said processor, said memory circuit including a memory array, voltage pump for supplying a pump voltage to said array, and a regulator circuit connected to said voltage pump, said regulator circuit comprising:

a voltage divider circuit connected between a first and second voltage, said voltage divider circuit having a resistance and outputting a reference voltage used to operate said pump;

a first adjustment circuit;

a first connection circuit, said first connection circuit connecting said first adjustment circuit to said voltage divider circuit in response to a first control signal and disconnecting said first adjustment circuit from said voltage divider circuit when the first control signal is not received, said first adjustment circuit when connected to said voltage divider circuit adjusting the resistance of said voltage divider circuit to modify a voltage level of said reference voltage;

a second adjustment circuit; and a said connection circuit, said second connection circuit connecting said second adjustment circuit to said voltage divider circuit in response to a second control signal and disconnecting said second adjustment circuit from said voltage divider circuit when the second control signal is not received, said second adjustment circuit when connected to said voltage divider circuit adjusting the resistance of said voltage divider circuit to modify a voltage level of said reference voltage, wherein said first and second control signals independently control said first and second connection circuit based upon an operating mode of said regulator circuit.

35. A processor system comprising:

a processor; and a memory circuit connected to said processor, said memory circuit including a memory array, voltage pump for providing a pumped voltage to said array, and a regulator circuit connected to said voltage pump, said regulator circuit comprising:

voltage divider means connected between a first and second voltage, said voltage divider means generating a reference voltage for operating said pump;

first adjustment means for adjusting a resistance of said voltage divider means to modify a voltage level of said reference voltage;

second adjustment means for adjusting the resistance of said voltage divider means to modify the voltage level of said reference voltage;

first connection means for connecting said first adjustment means to said voltage divider means in response to a first control signal, said first connection means disconnecting said first adjustment means from said voltage divider means when the first control signal is not received; and second connection means for connecting said second adjustment means to said voltage divider means in response to a second control signal, said second connection means disconnecting said second adjustment means from said voltage divider means when the second control signal is not received, wherein said first and second control signals independently control said first and second connection means.

* * * * *